DIODE DETECTOR HAVING INDIVIDUAL AUDIO AND RECTIFIED D-C DOUBLED OUTPUTS

Filed Dec. 28, 1964

INVENTOR.
ERNEST J. MOES
BY Moody and Kintzinger
ATTORNEYS

United States Patent Office 3,386,042
Patented May 28, 1968

3,386,042

DIODE DETECTOR HAVING INDIVIDUAL AUDIO AND RECTIFIED D-C DOUBLED OUTPUTS

Ernest J. Moes, Marion, Iowa, assignor to Collins Radio Company, Cedar Rapids, Iowa, a corporation of Iowa Filed Dec. 28, 1964, Ser. No. 421,330
6 Claims. (Cl. 329—204)

ABSTRACT OF THE DISCLOSURE

An amplitude modulation (AM) detector with fast D.C. rise time and relatively slow decay time capable of handling high percentage modulation even up in the 90% to 100% modulation range, and with substantially no distortion appearing in the audio output. The detector includes two diodes one connected anode and the other connected cathode directly by a common junction connection to an RF or IF signal passing coupling capacitor for receiving an AM input signal. The opposite electrodes of the two diodes are connected to, respectively, a voltage doubled positive D.C. output line and an audio output line. An RF bypass capacitor and resistor are connected, in parallel, between the two output lines, an audio bypass capacitor is connected between the audio output line and ground, and a resistor is connected between the audio output line and ground.

Figure 1:
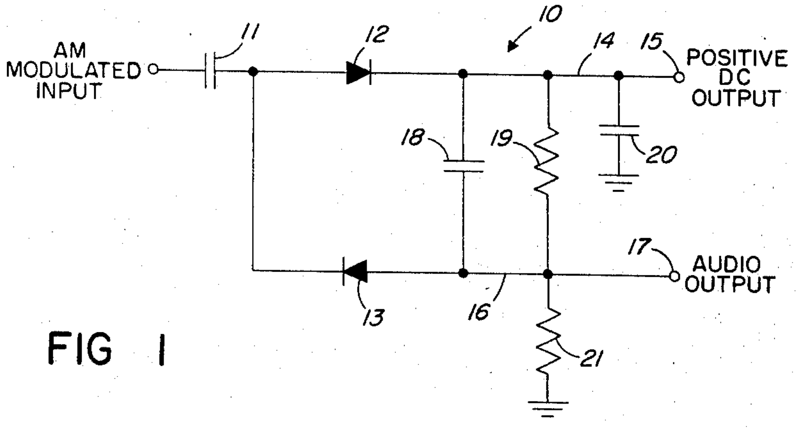

This invention relates in general to diode doubler detectors for detecting AM signals and providing a D.C. output and an audio output, and in particular to a diode detector capable of providing separate audio and doubled D.C. outputs with filtering circuitry integral to the detector circuit.

There are various diode D.C. doubler detectors commonly used for detecting AM signals and providing a doubled D.C. output and an audio output. However, with many of these detectors a separation of the D.C. and audio signal components is normally done by RC filtering of the output. Furthermore, with many of these existing diode doubler detectors detection generally results in a D.C. of one polarity and an audio signal corresponding in phase to the same polarity portion of the modulated carrier signal. Various existing detectors require many filtering components acting on the signals passed by the detector to obtain the outputs desired. Some of these detectors also require special additional circuitry for obtaining fast D.C. rise time and slow decay time.

It is, therefore, a principal object of this invention to provide an improved diode detector giving a separate audio output and a separate rectified D.C. output in a detector circuit imposing minimum component requirements.

Another object is to provide such a diode detector with relatively simple filter circuitry without resistive impedance in the D.C. output circuit path and with the filter circuitry an integral essential part of the detector circuit.

A further object is to provide a D.C. detector capable of developing a D.C. output voltage of one polarity phase of the input and an audio output signal detected from the opposite polarity phase of an AM modulated input signal.

Another object of such a detector is to provide detection of relatively high percentages of audio modulation even up in the 90% to 100% modulation range with substantially no distortion of the audio output signal.

Still a further object is to provide such a detector capable of fast D.C. rise time and relatively slow decay time without requiring additional special circuitry.

Features of this invention useful in accomplishing the above objects include two diodes, one connected anode and the other connected cathode by a common junction connection to and through a signal coupling capacitor for receiving an AM modulated input signal. The opposite electrode of one of the diodes connected to a doubled D.C. output line and the opposite electrode of the other diode is connected to an audio output lin. An RF bypass capacitor and resistor are connected in parallel between the doubled D.C. output line and the audio output line. In addition, an audio bypass capacitor is connected between the D.C. output line and ground and a resistor is connected between the audio output line and ground. It is a diode doubler detector providing separate D.C. and audio outputs with the D.C. output voltage developed from one polarity phase of the input and an audio output signal detected from the opposite polarity phase of an input AM modulated signal. It is an amplitude modulation (AM) detector capable of handling high percentage modulation even up in the 90% to 100% modulation range with substantially no distortion appearing in the audio output.

Specific embodiments representing what are presently regarded as the base mode of carrying out the invention are illustrated in the accompanying drawing.

Figure 2:
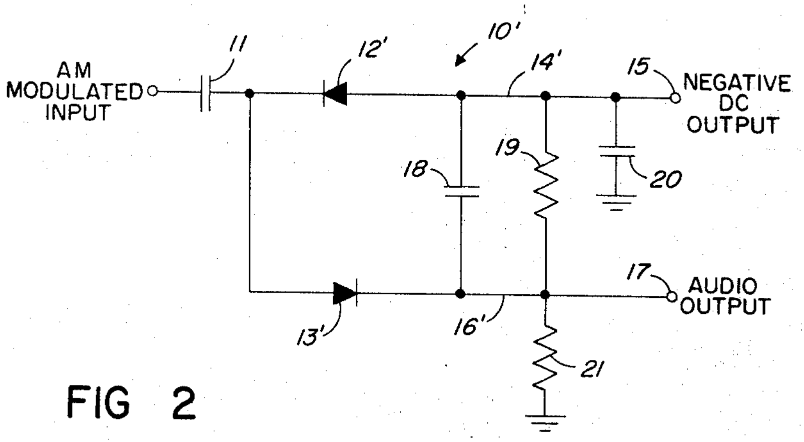

In the drawing:

FIGURE 1 represents a schematic view of a diode doubler detector, according to the invention, providing a separate positive D.C. output and a separate audio output detected from the negative portion of the modulated carrier input signal; and FIGURE 2, a schematic view of a diode doubler detector providing a separate negative D.C. output and an audio output detected from the positive portion of the modulated carrier input signal.

Referring to the drawing:

Applicant's doubler detector 10, as shown in FIGURE 1, is shown to have a connection for AM modulated signal input through coupling capacitor 11 to diodes 12 and 13. Diode 12 is connected anode to coupling capacitor 11 and cathode through output line 14 to positive D.C. output terminal 15. Diode 13 is connected in reverse relative to diode 12 with its cathode connected in common with the anode of diode 12 to capacitor 11 and its anode through line 16 to audio output terminal 17. RF bypass capacitor 18 and a resistor 19 are connected in parallel between lines 14 and 16. An RF and audio bypass capacitor 20 is also connected between line 14 and ground and a resistor 21 is connected between the audio output line 16 and ground.

Application of an AM modulated input signal through capacitor 11 results, with rectification through diode 12, in the development of a rectified voltage doubled positive D.C. output in line 14 and at output terminal 15. Very quickly with application of an AM input signal and the immediate rectification action of diode 12 the common junction of the anode of diode 12 and coupling capacitor 11 becomes more and more positive up to a quickly reached upper limit as determined by the excursion of the RF input signal. Any audio content that may exist in line 14 out of diode 12, and passed to line 14 through capacitor 18 and resistor 19, in parallel, from line 16 is bypassed to ground through RF and audio bypass capacitor 20. The diode 13 passes and rectifies the negative portions of the RF input signal and including any audio modulation on the negative phase of the AM modulated input signal to line 16. Substantially any RF remaining in the signal passed by the rectifying action of diode 13 is bypassed by RF bypass capacitor 18 to line 14 and through RF and audio bypass capacitor 20 to ground. Thus, substantially only detected audio remains on line 16 and at output terminal 17 developed across resistor 21 in parallel with resistor 19, in effect to ground, since line 14 is maintained effectively at audio ground through capacitor 20.

A diode doubler detector is hereby provided having a positive D.C. output voltage suitable for use in AGC circuitry and a separate audio output substantially free from distortion regardless of high modulation signal levels. These levels may be even up in the range of from 90% to 100% modulation on an input RF carrier with the resulting audio output suitable for application to following audio staging. Such beneficial operational results are, in large measure, a result of the development of the D.C. output voltage of one polarity phase of the input signal and the detection of the audio output signal as a separate output from the opposite polarity phase of the AM modulated input signal. It is a detector capable of fast D.C. rise time since there is substantially no resistive impedance in the D.C. output path while retaining a desired relatively slow decay time with a discharge path from D.C. output line 14 through resistors 19 and 21 to ground. It should be noted, however, with respect to audio detection that diode 13 will generally conduct portions of the negative polarity phase excursion of the RF carrier through generally the negative going portions of the audio modulation envelope. Then, generally, during the positive going portions of the negative polarity phase modulation envelope diode 13 is, generally, so reverse biased as to conduct less, if at all, and resultant current flow through resistor 21 at such time tends to raise the voltage potential of line 16 at the audio rate.

Components and values used, as a typical example, in a diode doubler detector according to the embodiment of FIGURE 1 acting on an AM modulated 500 kc. RF input signal and providing the operational results desired with such an input signal in the developed voltage doubled positive D.C. output and the separate audio output, include the following:

| | | |
|---|---|---|
| Capacitor **11** | picofarads | 100 |
| Diodes **12** and **13** | | 1N3064 |
| Capacitor **18** | picofarads | 2,000 |
| Resistor **19** | ohms | 10K |
| Capacitor **20** | microfarads | 15 |
| Resistor **21** | ohms | 47K |

The diode doubler detector embodiment of FIGURE 2, which develops a negative D.C. output and a separate audio output instead of the positive D.C. output in the FIGURE 1 embodiment, is substantially the same as the FIGURE 1 embodiment with only the diodes reversed. Since this is the case, the components exactly the same as in the embodiment of FIGURE 1 are numbered the same as a matter of convenience, and the reversed diodes are given primed numbers as well as the corresponding two output lines. Operation with this embodiment is, for all practical purposes, substantially the same as with the embodiment of FIGURE 1, however, with reversal of polarity phase of operation the development of negative D.C. output and with the audio detected from the positive polarity phase of the AM modulated RF input signal.

Whereas this invention is here illustrated and described with respect to two embodiments thereof, it should be realized that various changes may be made without departing from the essential contributions to the art made by the teachings hereof.

I claim:

1. In an AM diode detector having separate demodulated signal and D.C. outputs: AM modulated RF signal input coupling means for connection to a signal source; at least two unidirectional electrical conductive devices each with at least two electrodes subject to unidirectional conduction from one electrode to the other when biased in one direction, with opposite bias direction electrodes of said unidirectional conductive devices directly connected in common to said signal input coupling means; D.C. output line means connected to the other electrode of one of said unidirectional conductive devices; demodulated signal output line means connected to the other of said unidirectional conductive devices; with signal paths from said signal input coupling means being to and through said unidirectional electrical conductive devices to the said D.C. output line means and the said demodulated signal output line means; capacitive means, and impedance means connected in parallel between said D.C. output line means and said demodulated signal output line means; capacitive means connected between said D.C. output line means and a voltage potential reference; and impedance means connected between said demodulated signal output line means and the voltage potential reference.

2. The diode detector of claim 1, wherein said unidirectional conductive devices are diodes each having a cathode and an anode and with the anode of one diode and the cathode of the other diode connected to said signal coupling input means.

3. The diode detector of claim 2, wherein said input coupling means is an RF signal coupling capacitor; said demodulated signal is an audio signal detected from an audio modulated RF input signal; said capacitive means connected in parallel with impedance means between the D.C. output line means and said audio output line means is an RF bypass capacitor; and said capacitive means connected between said D.C. output line means and a voltage potential reference is both an audio and RF bypass capacitor.

4. The diode detector of claim 3, wherein both said impedance means are resistive means, with the resistive means connected between the audio output line means and the voltage potential reference being of greater resistive value than the other resistor; and with the voltage potential reference being ground.

5. The diode detector of claim 2, wherein one diode is connected anode to said input coupling means and cathode to said D.C. output line means for developing a positive D.C. output; and the other diode is connected cathode to said input coupling means and anode to the audio output line means.

6. The diode detector of claim 2, wherein one diode is connected cathode to said input coupling means and anode to said D.C. output line means for developing a negative D.C. output; and the other diode is connected anode to said input coupling means and cathode to the audio output line means.

References Cited

UNITED STATES PATENTS

| | | | |
|---|---|---|---|
| 2,497,840 | 2/1950 | Seeley | 329—130 |
| 2,528,182 | 10/1950 | Sands et al. | 329—136 X |
| 2,833,921 | 5/1958 | McCroy | 325—487 X |

FOREIGN PATENTS

| | | |
|---|---|---|
| 485,706 | 8/1952 | Canada. |

ALFRED L. BRODY, *Primary Examiner.*